United States Patent
Tamiya

(10) Patent No.: US 8,364,448 B2
(45) Date of Patent: Jan. 29, 2013

(54) MODEL GENERATING METHOD AND DEVICE AND RECORDING MEDIUM

(75) Inventor: Yutaka Tamiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 263 days.

(21) Appl. No.: 12/797,363

(22) Filed: Jun. 9, 2010

(65) Prior Publication Data

US 2010/0318342 A1 Dec. 16, 2010

(30) Foreign Application Priority Data

Jun. 10, 2009 (JP) ................. 2009-138838

(51) Int. Cl.
*G06F 17/50* (2006.01)
*G06F 3/00* (2006.01)

(52) U.S. Cl. .................. 703/2; 703/13; 703/22; 703/24; 370/252; 370/335

(58) Field of Classification Search ................ 703/2, 13; 370/252, 335
See application file for complete search history.

(56) References Cited

U.S. PATENT DOCUMENTS

| | | | |
|---|---|---|---|
| 2006/0023636 A1* | 2/2006 | Farhang-Boroujeny et al. | ............................. 370/252 |
| 2007/0076669 A1* | 4/2007 | Boroujeny et al. | ........... 370/335 |
| 2007/0277144 A1 | 11/2007 | Veller et al. | |
| 2009/0003483 A1* | 1/2009 | Farhang-Boroujeny et al. | ............................. 375/262 |

FOREIGN PATENT DOCUMENTS

| | | |
|---|---|---|
| JP | 10-228491 | 8/1998 |
| JP | 2004-138525 | 5/2004 |

* cited by examiner

*Primary Examiner* — Thai Phan
(74) *Attorney, Agent, or Firm* — Staas & Halsey LLP

(57) ABSTRACT

A method includes causing a circuit simulator to perform a circuit simulation using circuit data stored in a storage, the circuit data containing a module to be modeled and a circuit for making a change to a clock to be inputted into the module and clock setting data stored in a storage, the clock setting data being intended to, at a predetermined timing, make a change to the clock to be inputted into the module, and storing a result of the circuit simulation in a simulation result data storage; and generating a hidden markov model about input and output signals of the module from values and times of the signals in accordance with a predetermined algorithm, the values and times being contained in the circuit simulation result stored in the simulation result data storage, and storing data about the model in a hidden markov model data storage.

9 Claims, 14 Drawing Sheets

FIG.7

| TIME | INPUT SIGNALS |
|---|---|
| 9 | M1.Out="T1" |
| 16 | M1.In="t1" |
| 19 | M1.Out="T2" |
| 25 | M1.In="t2" |
| ⋮ | ⋮ |

FIG.8

| TIME | OUTPUT SIGNALS |
|---|---|
| 10 | M2.In="T1" |
| 15 | M2.Out="t1" |
| 20 | M2.In="T2" |
| 24 | M2.Out="t2" |
| ⋮ | ⋮ |

FIG.9

| START TIME ts1 | END TIME ts2 | ADJUSTMENT COEFFICIENT k |
|---|---|---|
| 20 | 24 | k1 |
| 60 | 63 | k2 |
| ⋮ | ⋮ | ⋮ |

FIG.13

| ITEM NUMBER | TIME CONSTRAINT | SIGNAL CONDITION |
|---|---|---|
| (A1) | Tt1 | M2.In="T1" |
| (A2) | ( Tt1 + 0 ) ~ ( Tt1 + 5 ) | M2.Out="t1" |
| (B1) | Tt2 | M2.In="T2" |
| (B2) | ( Tt2 + 4 ) ~ ( Tt2 + 15 ) | M2.Out="t2" |
| ⋮ | ⋮ | ⋮ |

MODEL GENERATING METHOD AND DEVICE AND RECORDING MEDIUM

CROSS-REFERENCE TO RELATED APPLICATIONS

This application is based upon and claims the benefit of priority of the prior Japanese Patent Application No. 2009-138838, filed on Jun. 10, 2009, the entire contents of which are incorporated herein by reference.

FIELD

The embodiments discussed herein are related to a modeling of a circuit module.

BACKGROUND

While the development scale of LSIs (large scale integrated circuits) has been increased in recent years, the development period thereof has been reduced. Also, reductions in power consumption of LSIs have been a major challenge. Accordingly, in designing an LSI, the performance and power consumption of the LSI must be estimated in the initial stage. In order to estimate the performance and power consumption of the entire LSI, the components of the LSI, circuit modules, are converted into performance models (hereafter referred to as "models").

Examples of the technology for modeling circuit modules include a technology that converts a low-level circuit description [e.g., hardware description language (HDL)] into a high-level circuit description [e.g., transaction-level model (TLM)]. This technology performs a simulation in a low-level circuit description and extracts a transaction from the result of the simulation. During this process, a signal pattern is mapped into a message, which is then converted into the transaction. Subsequently, a model is extracted. In extracting the model, attention is paid to the repeating mutual relationship between the input sequence and the output sequence, and a neural network is used to generate output messages and to estimate the statistic behavior of components. Data dependency is also extracted. Finally, a highly abstracted model is generated. This model is obtained by analyzing an input transaction or message and then outputting an output transaction or message. During that process, attention is paid not to the signal level or the like but to the timing of the message or the relationship. However, how the simulation is performed is not examined in detail.

In order to logically verify a digital system including an LSI, an external module communicating with the hardware to be verified is simulated using software. Used at that time is a technology for delaying the frequency at which the clock is provided to the hardware. This technology, however, has nothing to do with model generation.

There is also a technology that, in performing a simulation of cycle-accurate operation or a simulation of function and logic, explores various designs with respect to clock frequency control on each of the function blocks of an LSI design or buffer insertion while easily changing the configuration. Specifically, the technology includes frequency control means that, in verifying function and logic using data of an LSI design as an input, assigns the operating frequency to each of the function blocks constituting the LSI to be verified, clock frequency change means that changes the operating clock of each function block in accordance with the operating frequencies assigned by the frequency control means, and function simulation means that performs a function simulation of the operating clock-changed LSI. The frequency control means assigns all the function blocks the operating frequencies corresponding to the states thereof. The clock frequency change means changes the operating clock of each function block in accordance with the assigned operating frequencies. The function simulation means performs a function simulation of the LSI including the operating clock-changed function blocks. The above-mentioned process is repeated to obtain an optimum solution. As seen, an operating clock suitable for each function block is easily assigned and then the LSI is verified by performing a function simulation of the entire LSI. For this reason, this technology is believed to be capable of efficiently verifying the designs of LSIs with a short turnaround time as a whole. In this technology, however, it is not considered to generate a model.

In order to generate models accurately as described above, modules having complicated functions must be simulated under various operating conditions. However, preparing an enormous amount of simulation input data usually necessary to realize "various operating conditions" requires sufficient understanding of the function specification of each module, requiring much time and effort. That is, models are not easy to generate.

SUMMARY

A tangible computer-readable recording medium storing a program for causing a computer to perform a process includes causing a circuit simulator to perform a circuit simulation using (i) circuit data stored in a circuit data storage unit, the circuit data containing modules to be modeled and a circuit for making a change to a clock to be inputted into each module and (ii) clock setting data stored in a clock setting data storage unit, the clock setting data being intended to, at a predetermined timing, make a change to the clock to be inputted into the module, and storing a result of the circuit simulation in a simulation result data storage unit; and generating a hidden markov model about input and output signals of the module from values and times of the signals in accordance with a predetermined algorithm, the values and times being contained in the circuit simulation result stored in the simulation result data storage unit, and storing data about the hidden markov model in a hidden markov model data storage unit.

The object and advantages of the various embodiments will be realized and attained by means of the elements and combinations particularly pointed out in the claims.

It is to be understood that both the foregoing general description and the following detailed description are exemplary and explanatory and are not restrictive of the various embodiments, as claimed.

BRIEF DESCRIPTION OF DRAWINGS

FIG. 7 illustrates an example of a circuit simulation of a module M1;

FIG. 8 illustrates an example of a circuit simulation of a module M2;

FIG. 9 illustrates an example of data stored in a clock setting storage unit;

FIG. 13 illustrates an example of data stored in an expected value data storage unit.

DESCRIPTION OF EMBODIMENTS

Figure 1:
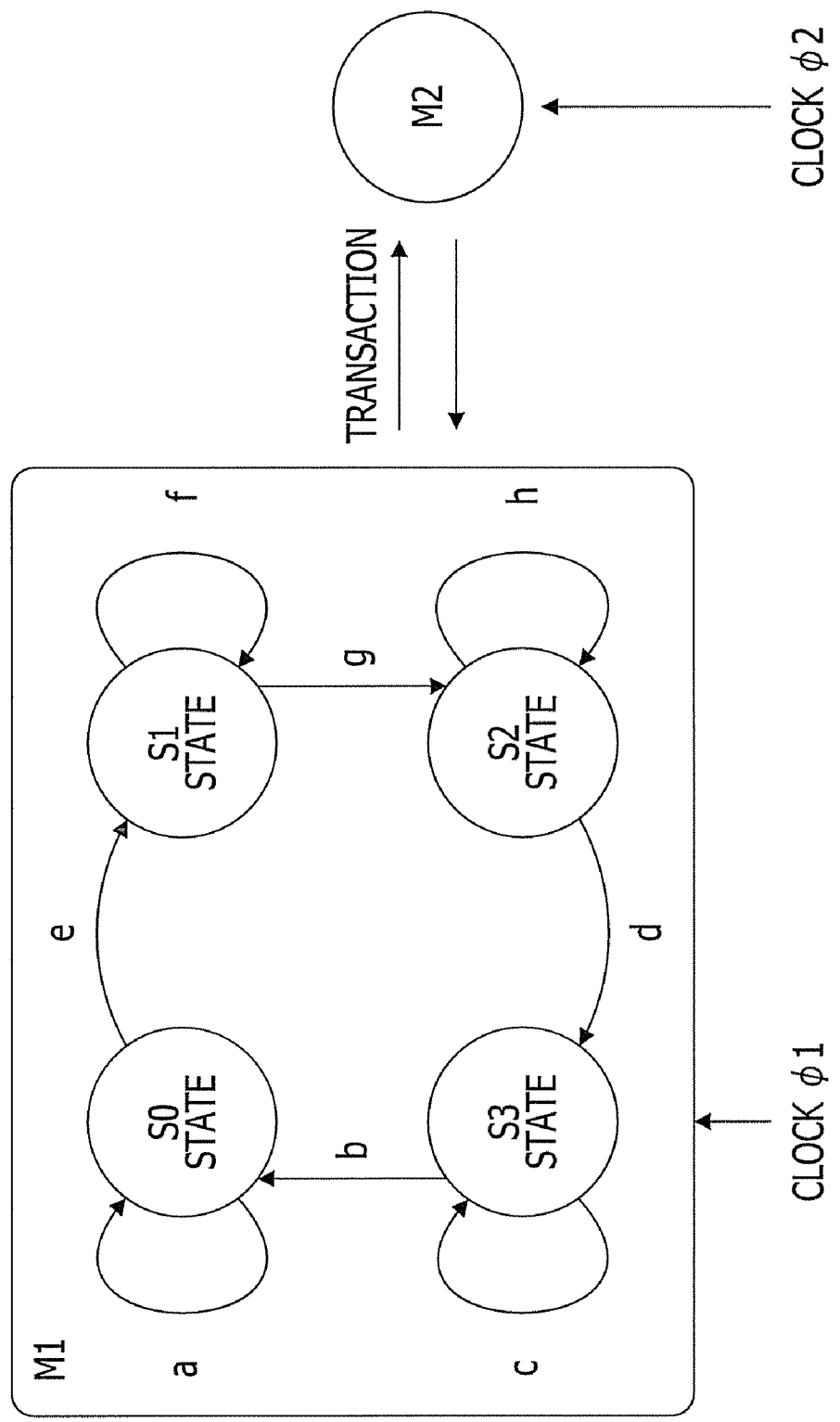
FIG. 1 illustrates an HMM of a circuit module.

In one embodiment, one of performance models, a hidden markov model (HMM), is employed. More specifically, transactions conducted between mutually-communicating two modules, M1 and M2, are learned using a known learning method so as to generate an HMM. To simplify the explanation, it is assumed that the modules communicate with each other asynchronously. As illustrated in FIG. 1, the HMM of the module M1 is defined by multiple states S0 to S3, the state transitions between the states (including self-transitions), the conditions for the state transitions (that is, state transition probabilities), outputs, and the conditions for the outputs (including output values and occurrence probabilities thereof) a to h. Although not illustrated in FIG. 1, an HMM is also generated for the module M2. Typically, the HMM of the module M1 differs from that of the module M2 in the number of states, the state transitions, the conditions for the state transitions, outputs, and the conditions for the outputs.

There are various known technologies to generate HMMs. For example, there are algorithms such as the EM algorithm and the Baum-Welch algorithm, and any algorithm may be used. Use of such a learning algorithm allows determining the states of the HMM, the state transitions, the conditions of the state transitions, outputs, and the conditions for the outputs so that a state transition for causing a transaction suitable for the operations of the circuit modules M1 and M2 occurs in the HMM.

Figure 2:
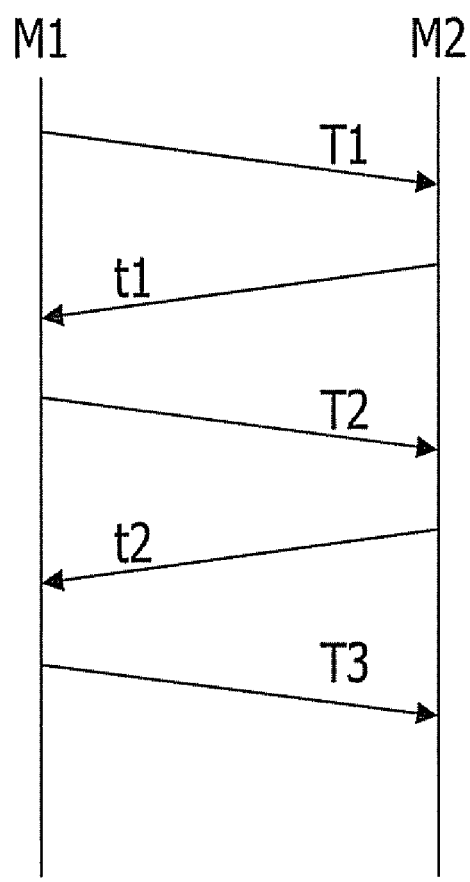
FIG. 2 illustrates an example of the transaction sequence between modules.

For example, assume that a transaction illustrated in FIG. 2 is conducted between the modules M1 and M2 and that the result of observation of the transaction is learned by a known learning algorithm. Specifically, the module M1 outputs a signal (or message) T1 to the module M2, then the module M2 outputs a signal (or message) t1 to the module M1, then the module M1 outputs a signal T2 to the module M2, then the module M2 outputs a signal t2 to the module M1, and then the module M1 outputs a signal T3 to the module M2.

From such a transaction sequence, there seems to be a cause-effect relationship where the signal t1 is outputted in response to the signal T1, the signal T2 is outputted in response to the signal t1, the signal t2 is outputted in response to the signal T2, and the signal T3 is outputted in response to the signal t2. However, whether such a relationship is correct is unknown. That is, learning only such data does not ensure generation of accurate HMMs.

For this reason, it is preferable to cause the modules M1 and M2 to perform different operations so that learning is performed in various transaction sequences to generate HMMs. However, causing the modules M1 and M2 to perform many different operations in a normal circuit simulation requires preparation of knowledge about the operations of the modules and an enormous amount of simulation input data.

Figure 3:
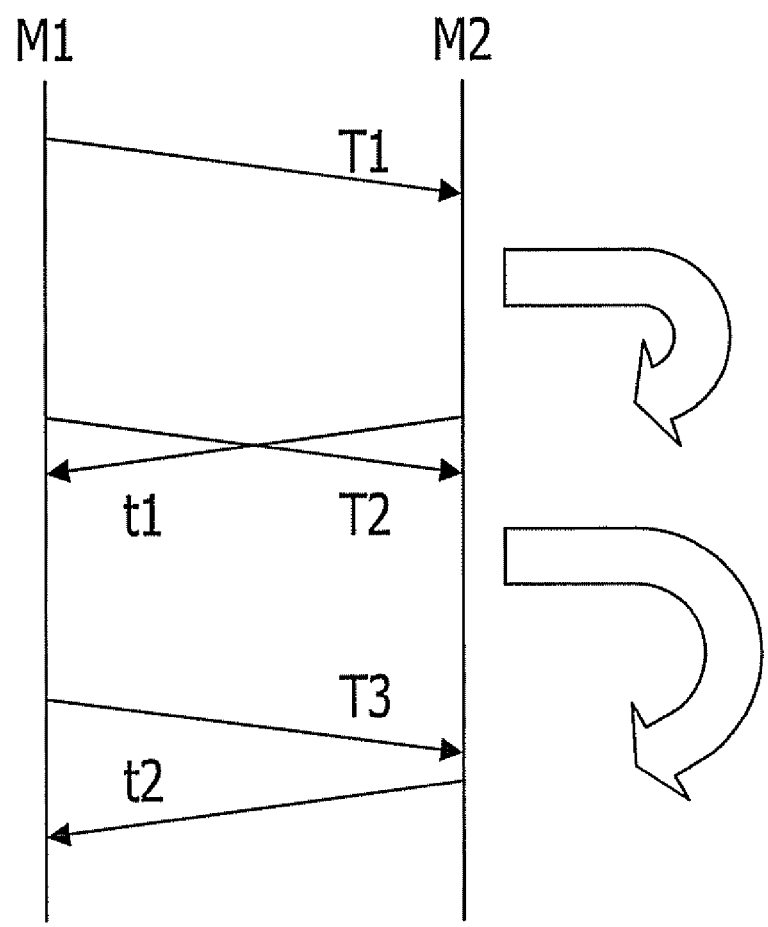
FIG. 3 illustrates is a discrepancy between signal output timings caused by a change in clock.

In this embodiment, the same simulation input is used; however, for example, a circuit simulation is performed in a state where a change is made to the clock of the module M2 (e.g., a reduction in frequency) and the transaction sequence is observed in the simulation. For example, in FIG. 3, the timings of the signals t1 and t2 outputted from the module M2 lag behind those illustrated in FIG. 2 as indicated by open arrows, while the timings of the signals T2 and T3 outputted from the module M1 make no changes. As seen, the inter-signal cause-effect relationship grasped from FIG. 2, as well as FIG. 3, where a change is made to the clock frequency, is different from that grasped from only FIG. 2. Thus, it is understood that cause-effect relationships are found between the signals and T1 and t1 and between the signals T2 and t2 and that no cause-effect relationships are found between the signals t1 and T2 and between the signals t2 and T3. Alternatively, the frequency may be increased.

As seen, using the existing circuit simulation input data as it is, rather than preparing new pieces of data, and making a change to a clock to be inputted into each module to be modeled allows performing various circuit simulations while reducing required time and effort. This allows observing various transaction sequences, thereby generating accurate HMMs.

Hereafter, there will be specifically described a configuration for making a change to a clock to be inputted into each module to be modeled so as to generate an HMM.

Figure 4:
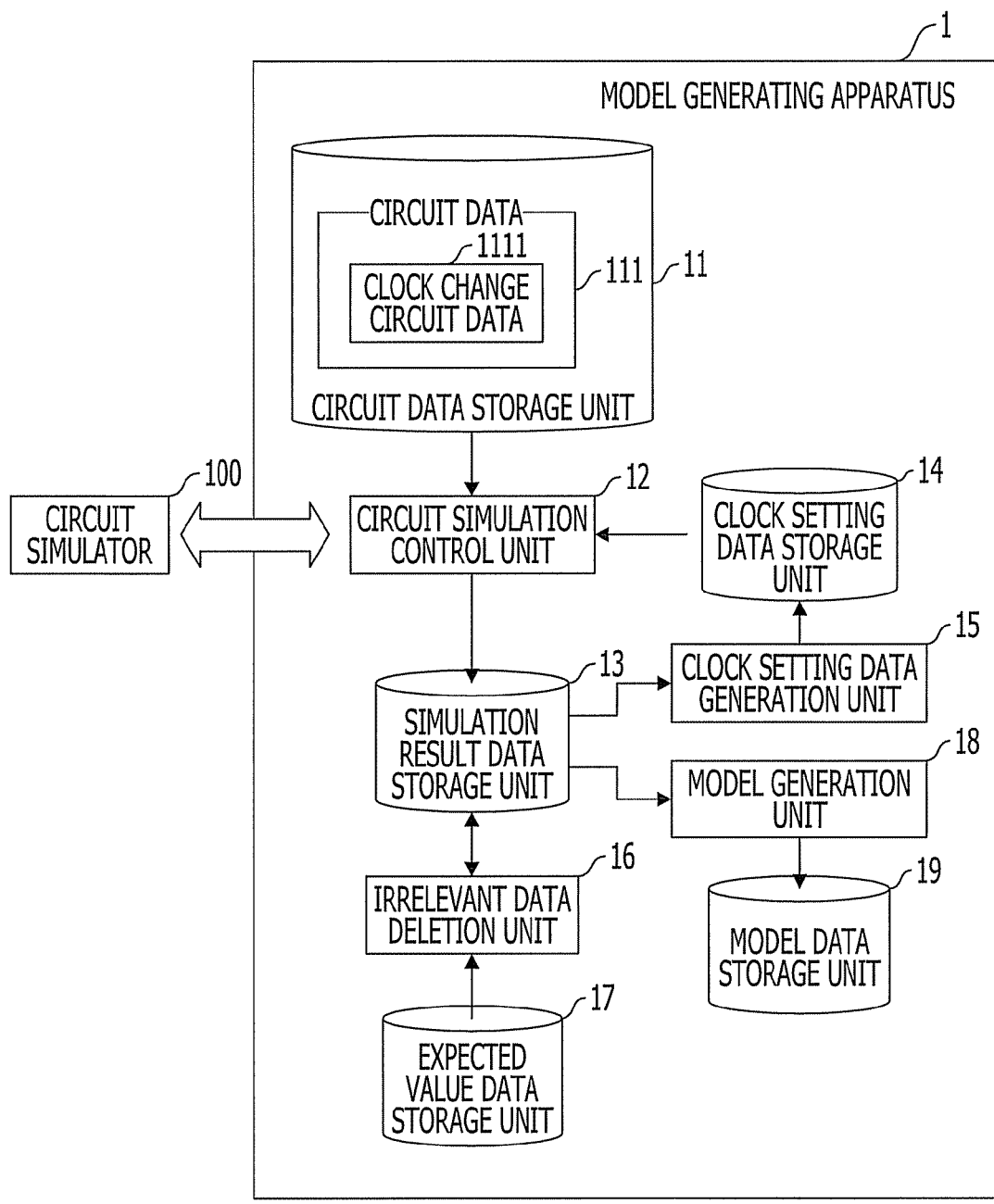
FIG. 4 illustrates an example configuration of a model generating apparatus.

FIG. 4 illustrates the function blocks of a model generating apparatus 1 according to this embodiment. The model generating apparatus 1 includes (a) a circuit data storage unit 11 that stores circuit data 111 containing clock frequency change circuit data 1111, which is data of a clock change circuit for making a change to a clock to be provided to each module to be modeled (as will be described below), and circuit data of the module to modeled, (b) a clock setting data storage unit 14 that stores clock setting data to be provided to the clock change circuit, (c) a circuit simulation control unit 12 that, using the data stored in the circuit data storage unit 11 and the data stored in the clock setting data storage unit 14, causes a known circuit simulator 100 to perform a circuit simulation and receives the result of the circuit simulation therefrom, (d) a simulation result data storage unit 13 that stores the circuit simulation result received by the circuit simulation control unit 12, (e) a clock setting data generation unit 15 that generates clock setting data using the data stored in the simulation result data storage unit 13 and stores the clock setting data in the clock setting data storage unit 15, (f) an expected value data storage unit 17 that stores expected value data of input and output signals of the module to be modeled, (g) an irrelevant data deletion unit 16 that deletes data irrelevant to generating a model from among circuit simulation results contained in the data stored in the simulation result data storage unit 13 and the data stored in the expected value data storage unit 17, (h) a model generation unit 18 that learns the data stored in the simulation result data storage unit 13 using a known learning method so as to generate a model, and (i) a model data storage unit 19 that stores HMM data generated by the model generation unit 18.

Figure 5:
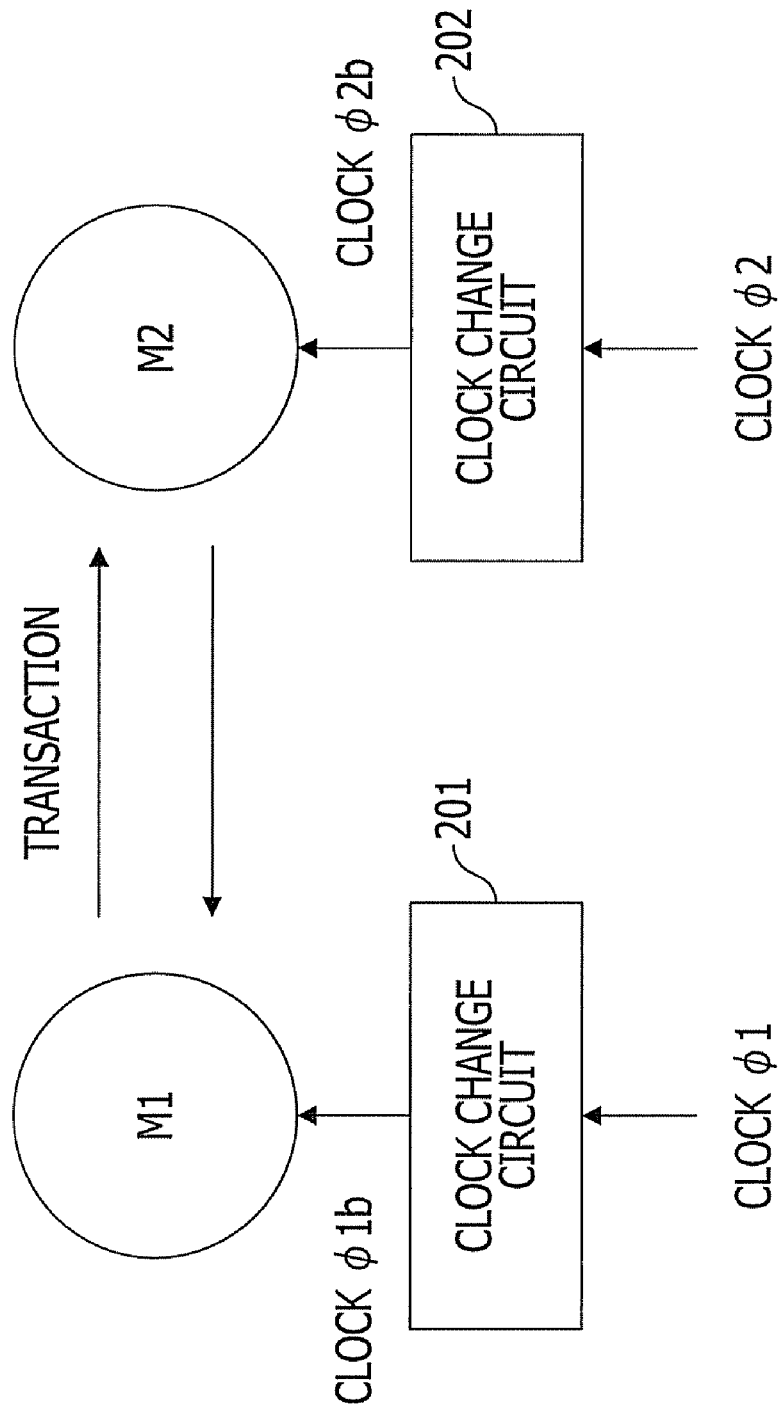
FIG. 5 illustrates an example configuration of a clock change circuit.
Figure 6:
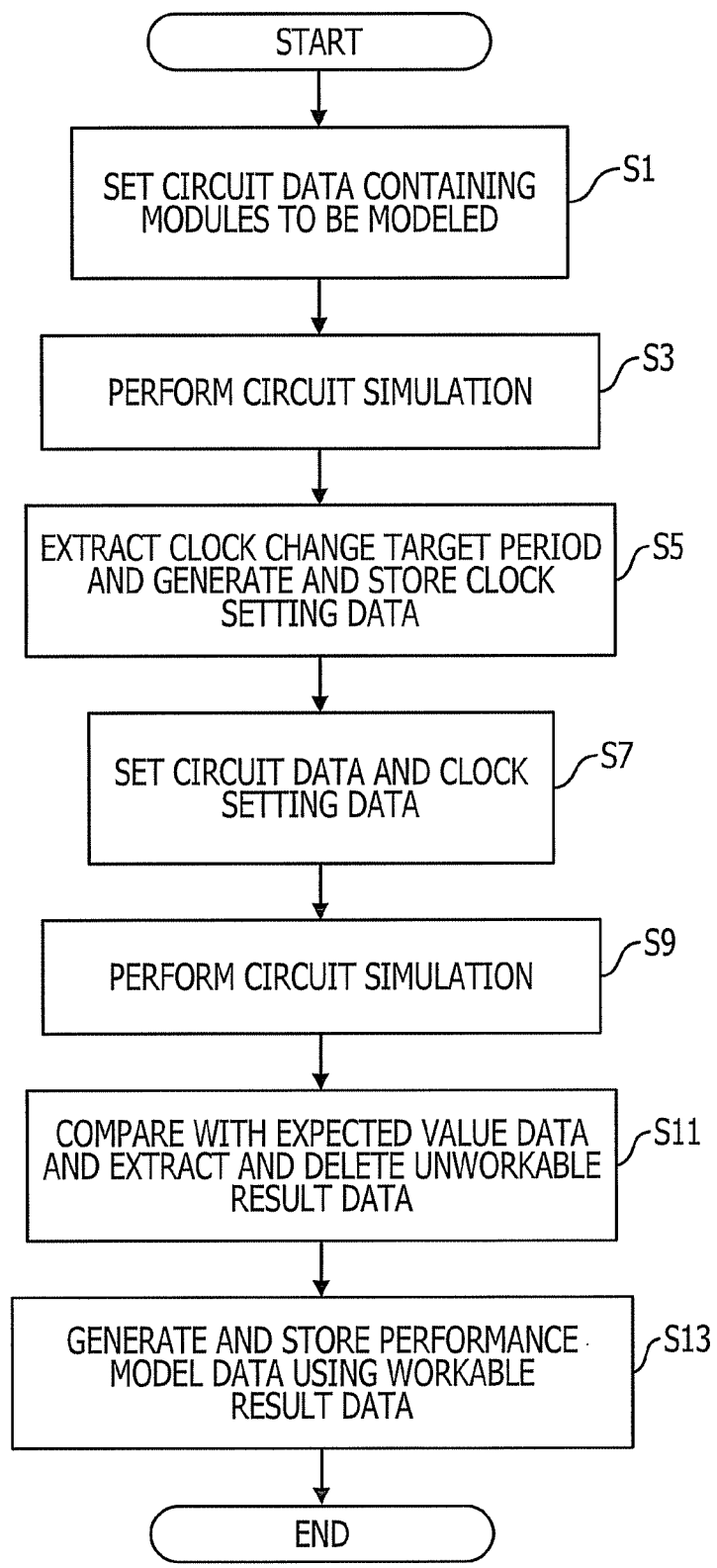
FIG. 6 illustrates an example of a main flow.

The clock change circuit will be roughly described with reference to FIG. 5. Usually, a clock φ1 is directly inputted to the module M1 to be modeled. In this embodiment, the clock φ1 is converted into a clock φ1b by a clock change circuit 201 and then inputted into the module M1. As such, usually, a clock φ2 is directly inputted into the module M2 to be modeled. In this embodiment, the clock φ2 is converted into a clock φ2b by a clock change circuit 202 and then inputted into the module M2. The clock change circuits 201 and 202 are, for example, circuits that multiplies the clock frequency of an input clock by a factor of X (X is a positive real number) and have a known configuration, and therefore will not be described any more. Instead of making a change to the frequency, a change such as changing of the duty ratio or the rising timing of the clock signal may be made. However, a change in frequency has a larger effect on the operation of the module and many variations can be used, which makes it easy to observe different operations. A change in frequency and other changes may be combined.

Referring now to FIGS. 6 to 13, the operation of the model generating apparatus 1 illustrated in FIG. 4 will be described. Assume that in a non-limiting example, prior to this operation, the circuit data 111 is stored in the circuit data storage unit 11. First, the circuit simulation control unit 12 sets, for the circuit simulator 100, the circuit data 111 stored in the circuit data storage unit 11 and containing the circuit data of the module to be modeled (step S1) and causes the circuit simulator 100 to perform a circuit simulation (step S3). In step S3, the circuit simulation control unit 12 causes the circuit simulator 100 to routinely perform the first circuit simulation with respect to one set of input data without using clock setting data, and then receives the result of the first circuit simulation from the circuit simulator 100 and stores the simulation result in the simulation result data storage unit 13.

The data stored in the simulation result data storage unit 13 is, for example, data illustrated in FIGS. 7 and 8. FIG. 7 illustrates an example of data relating to the module M1. Specifically, it is observed that the signal T1 has been outputted at a time 9 (that is, a signal having a value T1 has been outputted from the output terminal; the same goes for the below cases), the signal t1 has been inputted at a time 16 (that is, a signal having a value t1 has been inputted into the input terminal; the same goes for the cases below), the signal T2 has been outputted at a time 19, and the signal t2 has been inputted at a time 25). FIG. 8 illustrates an example of data relating to the module M2 to be modeled. Specifically, it is observed that the signal T1 has been inputted at a time 10, the signal ti has been outputted at a time 15, the signal T2 has been inputted at a time 20, and the signal t2 has been outputted at a time 24.

Subsequently, the clock setting data generation unit 15 extracts a clock change target period from the result of the first circuit simulation stored in the simulation result data storage unit 13, and generates clock setting data corresponding to the clock change target period and stores it in the clock setting data storage unit 14 (step S5). For example, if the time interval between an input signal and an output signal is less than a predetermined time length, the time interval is extracted as a clock change target period. For example, as to the module M2, assume that, if the time interval between an input signal and an output signal is less than "4," the time interval is extracted. In the case of FIG. 8, the time interval between the time 20, when the signal T2 has been inputted, and the time 24, when the signal t2 has been outputted, is extracted.

For example, the time interval thus extracted may be presented to the user in order to cause the user to specify a clock change target period. Alternatively, the user may be caused to specify all periods as a clock change target period. Alternatively, the clock change target period may be specified according to other criteria.

Subsequently, the clock setting data generation unit 15 generates clock setting data for making a change to the clock during the clock change target period and stores it in the clock setting data storage unit 14. For example, data as illustrated in FIG. 9 is stored in the clock setting data storage unit 14. In an example of FIG. 9, the data contains a start time ts1, an end time ts2, and an adjustment coefficient k. Here, it is assumed that the clock frequency is multiplied by the adjustment coefficient k (k is a positive real number). While a preset, fixed value may be used as k, for example, a random number may be employed that is generated within the range of more than 0 and equal to or less than the allowable maximum value (e.g., 1.5) in the design specification or the like.

Figure 10:
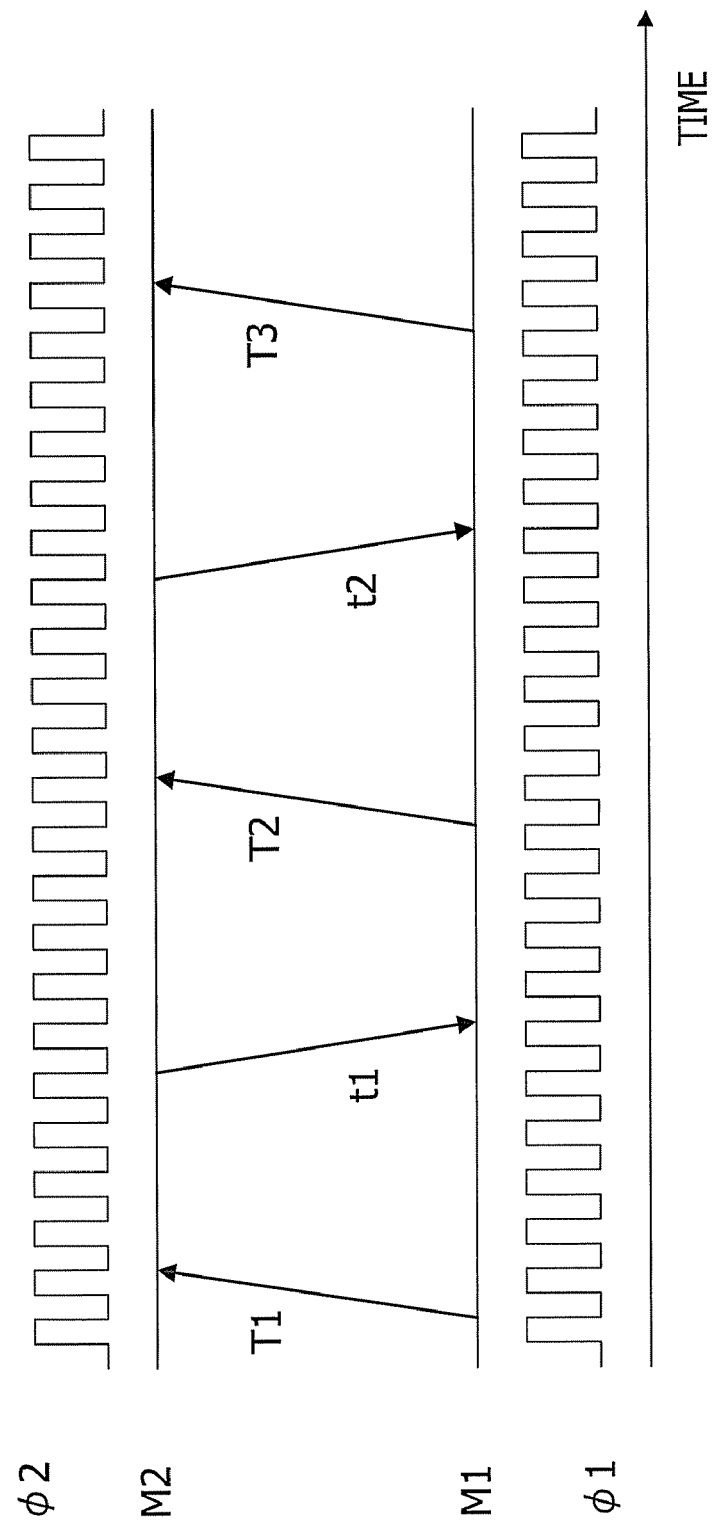
FIG. 10 illustrates the relationship between clocks φ1 and φ2 and the transaction sequence in a normal case.
Figure 11:
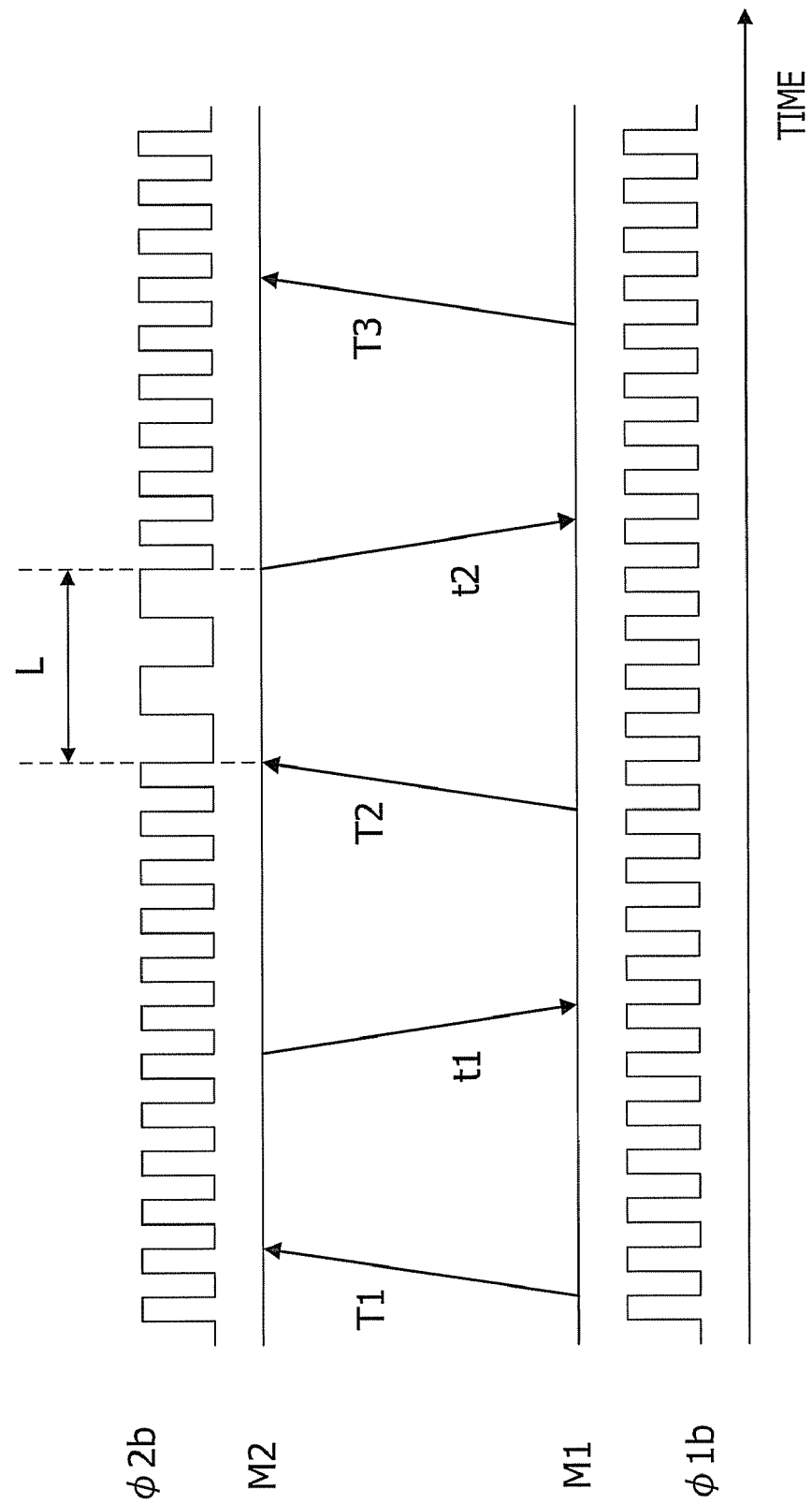
FIG. 11 illustrates the relationship between clocks φ1b and φ2b and the transaction sequence in a case where clock setting data is used.

This is schematically illustrated in FIG. 10. The module M1 to be modeled outputs the signals T1 to T3 to the module M2 to be modeled, and the module M2 outputs the signals t1 and t2 to the module M1. Usually, the clock φ1 is inputted into the module M1, and the clock φ2 is inputted into the module M2; therefore, no change is made to the clock frequency. On the other hand, as illustrated in FIG. 11, according to the clock setting data, the frequency of the clock φ2b to be inputted into the module M2 is, for example, halved only during a period L between the time when the module M2 receives the signal T2 from the module M1 and the time when the module M2 outputs the signal t2. At that time, whether the signal t2 is outputted in the same way and whether the subsequent signals (e.g., T3) are outputted in the same way are unknown. In any case, transactions between the modules are observed.

Besides multiplication of the frequency by a real number as described above, other change methods may be employed. Also, as illustrated in FIG. 9, multiple sets of data including, for example, different frequency adjustment coefficients k may be prepared. Performing the second and later circuit simulations (to be described below) with respect to each data set and using the results of the circuit simulations can generate accurate HMMs. Also, after preparing at least one set of clock setting data for multiple modules to be modeled, circuit simulations may be performed at a time; alternatively, after preparing at least one set of clock setting data for each of modules to be modeled, a circuit simulation may be performed for each module.

If data of a circuit module already exists but a performance model thereof has yet to be generated as in cases such as a case where a previously generated circuit module is reused and a case where a circuit module introduced from the outside is newly used, performing a circuit simulation in the above-mentioned way allows generation of clock setting data.

Note that, if the user can generate clock setting data using his or her own knowledge or other methods, steps S1 to S5 do not need to be performed.

Subsequently, when clock setting data is prepared, the circuit simulation control unit 12 sets, for the circuit simulator 100, the circuit data 111 stored in the circuit data storage unit 11, the clock setting data stored in the clock setting data storage unit 14, and one set of input data (step S7) so as to cause the circuit simulator 100 to perform a known circuit simulation (step S9). Subsequently, the circuit simulation control unit 12 receives the result of the second circuit simulation from the circuit simulator 100 and stores the simulation result in the simulation result data storage unit 13. The data stored in the simulation result data storage unit 13 takes the same formats as those illustrated in FIGS. 7 and 8. If multiple sets of clock setting data are generated, multiple circuit simulations are performed.

Figure 12:
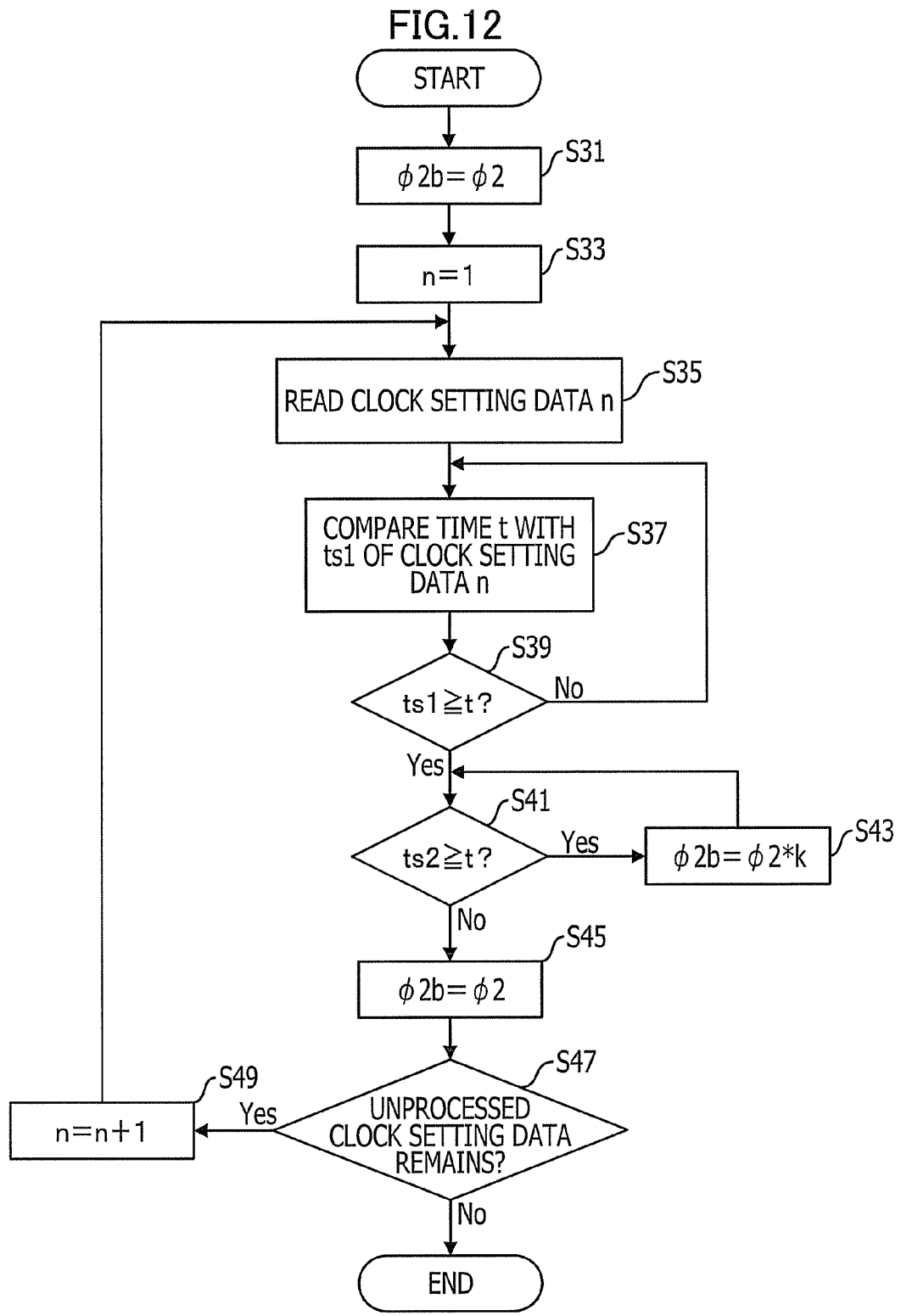
FIG. 12 illustrates an example of the process for setting the clock on the basis of clock setting data.

In the second and later circuit simulations, the clock change circuit performs, for example, a process illustrated in FIG. 12. First, the input clock φ2 is set for the output clock φ2b of the clock change circuit (step S31). A counter n of clock setting data is initialized to 1 (step S33). Subsequently, the n-th clock setting data is read (step S35) and a time t is compared with the start time ts1 of the n-th clock setting data (step S37). If the time t is earlier than the start time ts1 (step S39: No), the process returns to step S37. On the other hand, if the time t is the same or later than the start time ts1 (step S39: Yes) or the time t is the same or earlier than the end time ts2 (step S41: Yes), an input clock φ2*k (an adjustment coefficient contained in the clock setting data) is set for the output clock φ2b (step S43).

On the other hand, if the time t is later than the end time ts2 (step S41: No), the output clock φ2b is restored to the input clock φ2 (step S45). Subsequently, whether there remains unprocessed clock setting data is determined (step S47). If there remains such data, the counter n is incremented by 1 (step S49) and the process returns to step S35. If no such data is left, the process is completed. That is, the setting made in step S45 is maintained until the circuit simulation is completed.

In this way, a change can be made to the clock in the circuit simulation in accordance with the clock setting data.

Now, the process flow of FIG. 6 will be described again. When the results of the second and later circuit simulations are stored in the simulation result data storage unit 13, the irrelevant data deletion unit 16 compares the expected value data stored in the expected value data storage unit 17 with the circuit simulation result data stored in the simulation result data storage unit 13 so as to delete unworkable result data (step S11). FIG. 13 illustrates an example of data stored in the expected value data storage unit 17. FIG. 13 illustrates expected value data of the module M2 to be modeled. In an example of this figure, the time constraint and the signal condition are defined. For example, a condition is defined that the signal t1 is outputted in the period from (Tt1+0) to (Tt1+5) where Tt1 represents the time when the signal T1 is inputted. Similarly, a condition is defined that the signal t2 is outputted in the period from (Tt2+4) to (Tt2+15) where Tt2 represents the time when the signal T2 is inputted. These are only illustrative and a condition that the signals are not interdependent may be set. In principle, such expected value data is determined according to the design specification of the circuit including the modules to be modeled. Alternatively, a condition may be set according to the result of the first circuit simulation. The reason for conducting such checking is that an excessive change in clock using clock setting data may cause improper operation of the module and that it is not preferable to generate an HMM using the result data of a circuit simulation performed during such improper operation.

For example, a comparison is made between FIG. 13 and the circuit simulation result of FIG. 8. Since the signal T1 has been inputted at a time 10=Tt1 and the signal t1 has been outputted at a time 15=Tt1+5, the conditions of item numbers A1 and A2 are met. Also, since the signal T2 has been inputted at a time 20 and the signal t2 has been outputted at a time 24, the conditions of item numbers B1 and B2 are met. For example, if the signal t2 has been outputted at a time 40=Tt2+20, the conditions of item numbers B1 and B2 are not met, meaning that the module M2 does not operate properly. Accordingly, the result data of the module M2 is deleted.

After the irrelevant data deletion unit 16 completes the process, the model generation unit 18 generates performance model data, that is, HMM data using a known method on the basis of workable result data (for example, including the result of the first circuit simulation) stored in the simulation result data storage unit 13 and stores the HMM data in the model data storage unit 19 (step S13). As described above, a known method such as the EM algorithm or Baum-Welch algorithm is used to generate the HMM. The generated HMM data is defined by the states of the HMM, the state transitions, the conditions for the state transitions (the conditions under which each state transition occurs), outputs and the conditions for the outputs (the type of an output to be produced when a state transition occurs and the condition under which the output is produced)

Performing the above-mentioned process ensures that the modules to be modeled are caused to perform different operations without having to prepare an enormous amount of input data for use in circuit simulations, thus enabling automatic generation of a performance model using the operation results.

While the embodiment according to this technology has been described, this technology is not limited thereto. For example, the function block diagram illustrated in FIG. 4 is only illustrative and may not necessarily match an actual program module configuration.

If there is another model having an established learning method, such another model may be employed instead of an HMM and the model generation unit 18 may also be replaced with a model generation unit that performs such a learning method.

Figure 14:
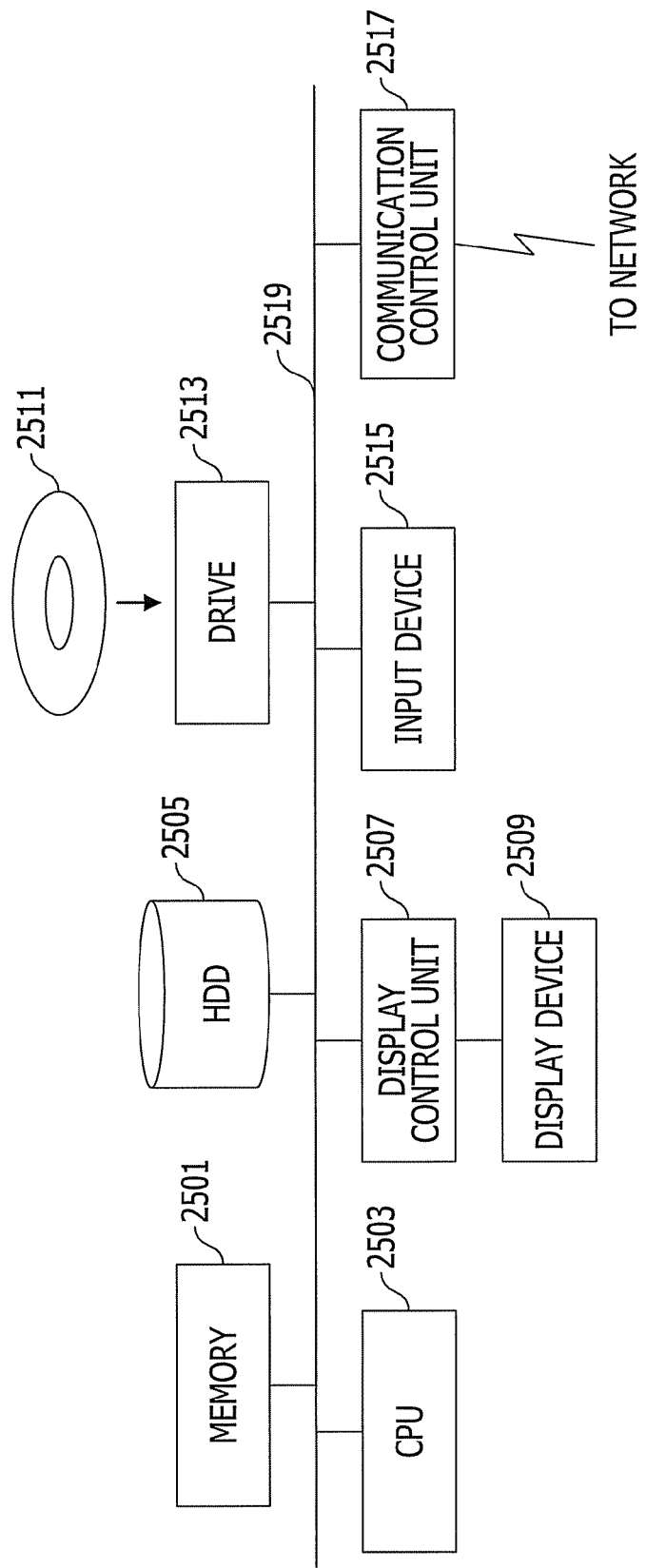
FIG. 14 illustrates an example configuration of a computer.

The above-mentioned model generating apparatus 1 is a computer. In the model generating apparatus 1, as illustrated in FIG. 14, a memory 2501, a CPU 2503, a hard disk drive (HDD) 2505, a display control unit 2507 connected to a display device 2509, a drive 2513 for a removable disk 2511, an input device 2515, and a communication control unit 2517 for connecting to networks are connected to one another via a bus 2519. The operating system (OS) and the application program for performing the process according to this embodiment are stored in the HDD 2505. The application program is read from the HDD 2505 to the memory 2501 and then performed by the CPU 2503. When necessary, the CPU 2503 controls the display control unit 2507, communication control unit 2517, and drive 2513 to cause them to perform necessary operations. Data in process is stored the memory 2501 and, when necessary, is stored in the HDD 2505. In the embodiment according to this technology, the application program for performing the above-mentioned process is distributed with it stored in the computer-readable removable disk 2511, and then installed from the drive 2513 to the HDD 2505. The application program may be installed the HDD 2505 via a network, such as the Internet, and the communication control unit 2517. In such a computer, hardware, such as the CPU 2503 and memory 2501, and the operating system and the necessary application program collaborate with each other to realize the above-mentioned various functions.

A model generating method according to this technology includes: (a) causing a circuit simulator to perform a circuit simulation using (i) circuit data stored in a circuit data storage unit, the circuit data containing a module to be modeled and a circuit for making a change to the clock to be inputted into the module and (ii) clock setting data stored in a clock setting data storage unit, the clock setting data being intended to, at a predetermined timing, make a change to the clock to be inputted into the module, and storing a result of the circuit simulation in a simulation result data storage unit; and (b) generating a hidden markov model about input and output signals of the module from values and times of the signals in accordance with a predetermined algorithm, the values and the times being contained in the circuit simulation result stored in the simulation result data storage unit, and storing data about the hidden markov model in a hidden markov model data storage unit.

As seen, disposing the clock change circuit and making a change to the clock in the circuit simulation can reduce the time and effort for generating data necessary to generate a hidden markov model.

This model generation method may further include (c) determining whether the circuit simulation result stored in the simulation result data storage unit meets the condition including the expected values of the values and times of the input and output signals to exclude a circuit simulation result not meeting the condition. This is intended to avoid the module to be modeled from being modeled based on the result of a circuit simulation performed based on improper operation of the module caused by an excessive change in clock.

The model generation method may further include: (d) causing the circuit simulator to perform a computer simulation without making a change to the clock using the above-mentioned circuit data stored in the circuit data storage unit and storing the result of the second circuit simulation in the simulation result data storage unit; and (e) extracting the start time and end time of a change period candidate from the second circuit simulation result stored in the simulation result data storage unit, the change period candidate being the time interval between an input into the module and an output therefrom, the time interval falling below a threshold, generating clock setting data containing the start time and end time, and storing the clock setting data in the clock setting data storage unit. As seen, a circuit simulation is routinely performed as a pre-process, and the above-mentioned change period candidate, which is the time interval between an input into the module to be modeled and an output therefrom that falls below the threshold, is specified as a period having a large effect on the operation of the module. Alternatively, a change may be made to the clock with respect to all the change period candidates, or the change period candidates may be presented to the user to cause the user to select one therefrom.

A program for causing a computer to perform the above-mentioned process may be generated. The program is stored in a tangible (non-transitory) computer-readable storage medium or storage device such as a flexible disk, CD-ROM, optical magnetic disk, semiconductor memory, or hard disk. Data in process may be stored temporarily in a storage device of the computer, such as the memory.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable medium as a non-transitory medium. The program/software implementing the embodiments may also be transmitted over communication path. Examples of the computer-readable recording medium may be a magnetic recording apparatus, an optical disk, a magneto-optical disk, a semiconductor memory (for example, RAM, ROM, etc.), or combination thereof. Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW.

According to the above-mentioned embodiment, the time and effort to generate models of LSI modules are reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A non-transitory computer-readable recording medium storing a program for causing a computer to perform a process, the process comprising:

causing a circuit simulator to perform a circuit simulation using (i) circuit data stored in a circuit data storage unit, the circuit data containing modules to be modeled and a circuit for making a change to a clock to be inputted into each module and (ii) clock setting data stored in a clock setting data storage unit, the clock setting data being intended to, at a predetermined timing, make a change to the clock to be inputted into each module, the simulation being performed under a state where a clock to be inputted to at least one module of the modules is changed from an original operation clock for the at least one module based on the clock setting data, and storing a result of the circuit simulation in a simulation result data storage unit; and generating a hidden Markov model related to input and output signals of each module from values and times of the signals in accordance with a predetermined algorithm, the values and times being contained in the circuit simulation result stored in the simulation result data storage unit, and storing data about the hidden Markov model in a hidden Markov model data storage unit.

2. The non-transitory computer-readable recording medium according to claim 1, the process further comprising:

determining whether the circuit simulation result stored in the simulation result data storage unit meets a condition including expected values of the values and the times of the input and output signals to exclude the circuit simulation result not meeting the condition.

3. The non-transitory computer-readable recording medium according to claim 1, the process further comprising:

causing the circuit simulator to perform a computer simulation without making a change to the clock using the circuit data stored in the circuit data storage unit, storing a result of a second circuit simulation in the simulation result data storage unit, extracting the start and end times of a change period candidate from the second circuit simulation result stored in the simulation result data storage unit, the change period candidate being the time interval between an input into the module and an output therefrom, the time interval falling below a threshold, generating clock setting data containing the start and end times, and storing the clock setting data in the clock setting data storage unit.

4. A method for generating a model, comprising:

causing a circuit simulator to perform a circuit simulation using (i) circuit data stored in a circuit data storage unit, the circuit data containing a module to be modeled and a circuit for making a change to a clock to be inputted into the module and (ii) clock setting data stored in a clock setting data storage unit, the clock setting data being intended to, at a predetermined timing, make a change to the clock to be inputted into the module, the simulation being performed under a state where a clock to be inputted to the module is changed from an original operation clock for the module based on the clock setting data, and storing a result of the circuit simulation in a simulation result data storage unit; and generating a hidden Markov model related to input and output signals of the module from values and times of the signals in accordance with a predetermined algorithm, the values and times being contained in the circuit simulation result stored in the simulation result data storage unit, and storing data about the hidden Markov model in a hidden Markov model data storage unit.

5. The method according to claim 4, further comprising:
determining whether the circuit simulation result stored in the simulation result data storage unit meets a condition including expected values of the values and the times of the input and output signals to exclude the circuit simulation result not meeting the condition.

6. The method according to claim 4, further comprising:
causing the circuit simulator to perform a computer simulation without making a change to the clock using the circuit data stored in the circuit data storage unit, storing a result of a second circuit simulation in the simulation result data storage unit, extracting the start and end times of a change period candidate from the second circuit simulation result stored in the simulation result data storage unit, the change period candidate being the time interval between an input into the module and an output therefrom, the time interval falling below a threshold, generating clock setting data containing the start and end times, and storing the clock setting data in the clock setting data storage unit.

7. A model generating apparatus, comprising:
a CPU to perform operation including:
causing a circuit simulator to perform a circuit simulation using (i) circuit data stored in a circuit data storage unit, the circuit data containing a module to be modeled and a circuit for making a change to a clock to be inputted into the module and (ii) clock setting data stored in a clock setting data storage unit, the clock setting data being intended to, at a predetermined timing, make a change to the clock to be inputted into the module, the simulation being performed under a state where a clock to be inputted to the module is changed from an original operation clock for the module based on the clock setting data, and stores a result of the circuit simulation in a simulation result data storage unit; and
generating a hidden Markov model related to input and output signals of the module from values and times of the signals in accordance with a predetermined algorithm, the values and times being contained in the circuit simulation result stored in the simulation result data storage unit, and stores data about the hidden Markov model in a hidden Markov model data storage unit.

8. The model generating apparatus according to claim 7, wherein the CPU further performs:
determining whether the circuit simulation result stored in the simulation result data storage unit meets a condition including expected values of the values and the times of the input and output signals to exclude the circuit simulation result not meeting the condition.

9. The model generating apparatus according to claim 7, wherein the CPU further performs:
causing the circuit simulator to perform a computer simulation without making a change to the clock using the circuit data stored in the circuit data storage unit, storing a result of a second circuit simulation in the simulation result data storage unit, extracting the start and end times of a change period candidate from the second circuit simulation result stored in the simulation result data storage unit, the change period candidate being the time interval between an input into the module and an output therefrom, the time interval falling below a threshold, generating clock setting data containing the start and end times, and storing the clock setting data in the clock setting data storage unit.

* * * * *